(12) United States Patent
Chong et al.

(10) Patent No.: US 11,967,365 B2
(45) Date of Patent: Apr. 23, 2024

(54) BITCELL ARCHITECTURE WITH TIME-MULTIPLEXED PORTS

(71) Applicant: Arm Limited, Cambridge (GB)

(72) Inventors: Yew Keong Chong, Austin, TX (US); Bikas Maiti, Austin, TX (US); Venu Anantuni, Austin, TX (US); Martin Jay Kinkade, Austin, TX (US)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/898,401

(22) Filed: Jun. 10, 2020

(65) Prior Publication Data
US 2020/0395064 A1    Dec. 17, 2020

Related U.S. Application Data

(60) Provisional application No. 62/860,021, filed on Jun. 11, 2019.

(51) Int. Cl.
*G11C 11/412* (2006.01)
*G11C 11/419* (2006.01)

(52) U.S. Cl.
CPC .......... *G11C 11/412* (2013.01); *G11C 11/419* (2013.01)

(58) Field of Classification Search
CPC ............................ G11C 11/412; G11C 11/419
USPC ...................................................... 365/154
See application file for complete search history.

(56) References Cited

U.S. PATENT DOCUMENTS

| | | | | |
|---|---|---|---|---|
| 5,642,325 A * | 6/1997 | Ang | ........................ | G11C 8/16 365/156 |
| 2007/0139997 A1* | 6/2007 | Suzuki | .................. | G11C 11/412 365/154 |
| 2008/0181040 A1* | 7/2008 | Huang | .................. | G11C 11/412 365/219 |
| 2008/0186791 A1* | 8/2008 | Lih | ........................ | G11C 11/417 365/226 |
| 2009/0109732 A1* | 4/2009 | Houston | ............... | G11C 11/412 365/154 |
| 2009/0129174 A1* | 5/2009 | Madurawe | ........... | G11C 11/412 365/189.08 |
| 2012/0140552 A1* | 6/2012 | Seikh | .................... | G11C 11/412 365/156 |
| 2012/0306021 A1* | 12/2012 | Samavedam | ......... | G11C 11/412 257/369 |
| 2013/0182494 A1* | 7/2013 | Badrudduza | ............ | G11C 8/16 365/156 |
| 2013/0242677 A1* | 9/2013 | Iyer | ........................ | G11C 8/16 365/189.16 |
| 2013/0258757 A1* | 10/2013 | Iyer | ....................... | G11C 11/419 365/154 |
| 2014/0293682 A1* | 10/2014 | Shah | ........................ | G11C 7/12 365/156 |

(Continued)

*Primary Examiner* — Sung Il Cho
(74) *Attorney, Agent, or Firm* — Pramudji Law Group PLLC; Ari Pramudji

(57) ABSTRACT

Various implementations described herein are related to a device having a memory cell with logic that is configured to store data and passgates that are configured to access the data stored in the logic. The device may include a first number of input-output ports that are time-multiplexed with the passgates so as to increase the first number of input-output ports to a second number of input-output ports that is greater than the first number of input-output ports.

20 Claims, 7 Drawing Sheets

(56) References Cited

U.S. PATENT DOCUMENTS

| | | | | |
|---|---|---|---|---|
| 2015/0003174 A1* | 1/2015 | Joshi | ................ | G11C 5/145 |
| | | | | 365/189.11 |
| 2015/0043270 A1* | 2/2015 | Singh | ................ | G11C 11/419 |
| | | | | 365/154 |
| 2015/0170734 A1* | 6/2015 | Hwang | ................ | G11C 7/12 |
| | | | | 365/72 |
| 2015/0310909 A1* | 10/2015 | Chu | ................ | G11C 11/419 |
| | | | | 365/154 |
| 2015/0332755 A1* | 11/2015 | Singh | ................ | G11C 11/419 |
| | | | | 365/72 |
| 2020/0327931 A1* | 10/2020 | Cosemans | ................ | G11C 8/08 |

* cited by examiner

BITCELL ARCHITECTURE WITH TIME-MULTIPLEXED PORTS

CROSS-REFERENCE TO RELATED APPLICATIONS

This patent application claims the benefit of and priority to U.S. provisional patent application Ser. No. 62/860,021, titled "METHOD AND APPARATUS FOR BITCELL," filed Jun. 11, 2019, and the entire disclosure of which is incorporated herein by reference.

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern memory applications, conventional bitcells may be implemented with a large number of transistors (e.g., 18 or more transistors). However, these conventional bitcells face many challenges and other inefficiencies. For instance, the large number of transistors often need many bitlines and wordlines, which can cause routing congestion within the bitcell. Also, a larger area on-chip is needed to implement the large number of transistors, bitlines and wordlines, which can degrade performance and increase power consumption. Also, a higher read/write margin is needed due to an increase in sensitivity to asymmetric layout and process variation. As such, conventional bitcell design for multi-port memory applications is typically inefficient for a large number of ports.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to bitcell architecture for physical design applications, such as, e.g., memory applications. The various schemes and techniques described herein may provide for multi-transistor bitcell architecture, such as, e.g., a 9-transistor (or 11-transistor) 7-port register file bitcell with TVD (transient Vss or Vdd droop) write assist schemes. Thus, a novel 7-port bitcell architecture that uses 9T configurations and 11T configurations are provided herein that offer significant area and power savings when compared to conventional multi-transistor bitcells. Also, the various schemes and techniques described herein may provide for a novel write assist technique that uses a transient Vss/Vdd droop (TVD) to solve write margin issues that are typically found in conventional multi-port bitcell architectures.

Various implementations of bitcell architecture will be described in detail herein with reference to FIGS. 1A-3.

Figure 1A:
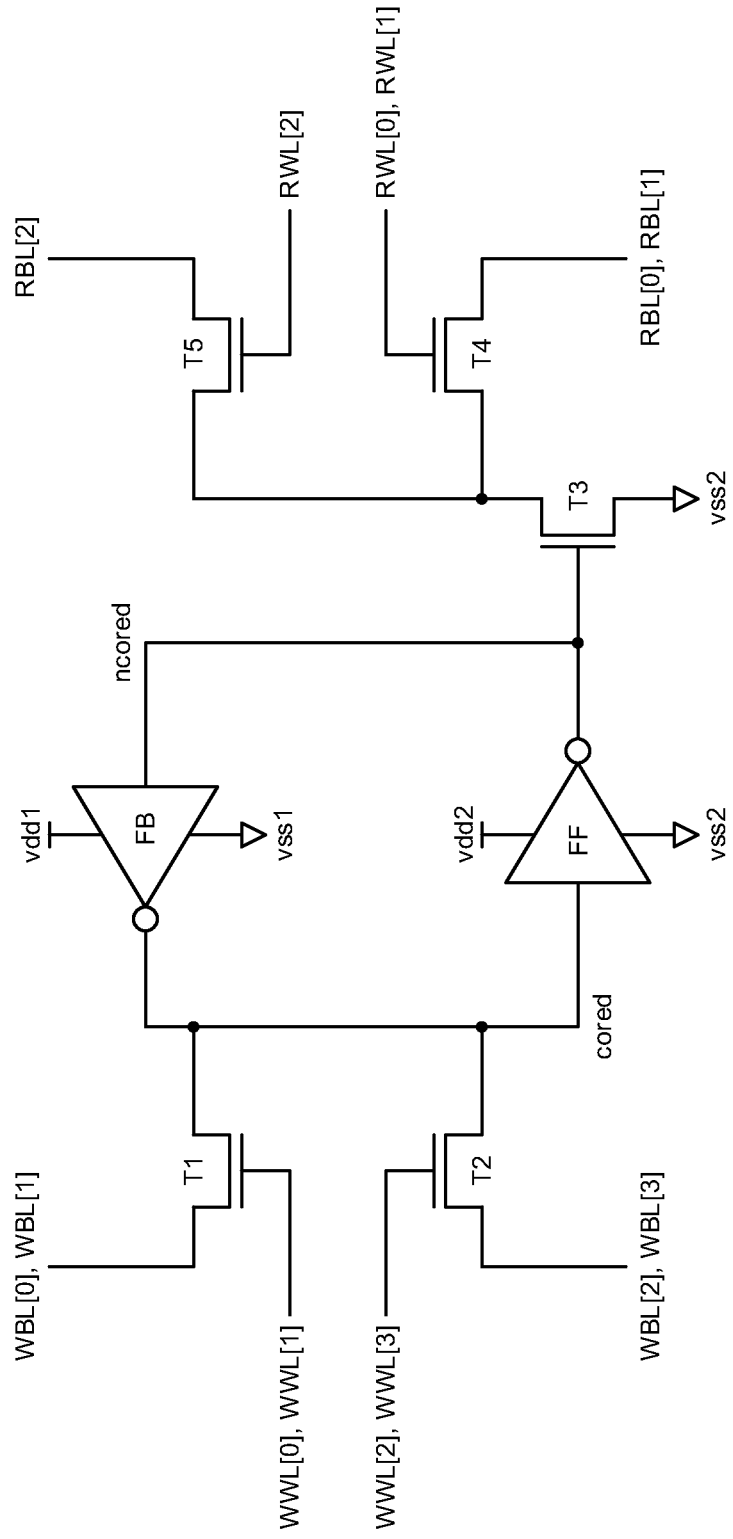
FIGS. 1A-1D illustrate various diagrams of bitcell architecture in accordance with various implementations described herein.
Figure 1B:
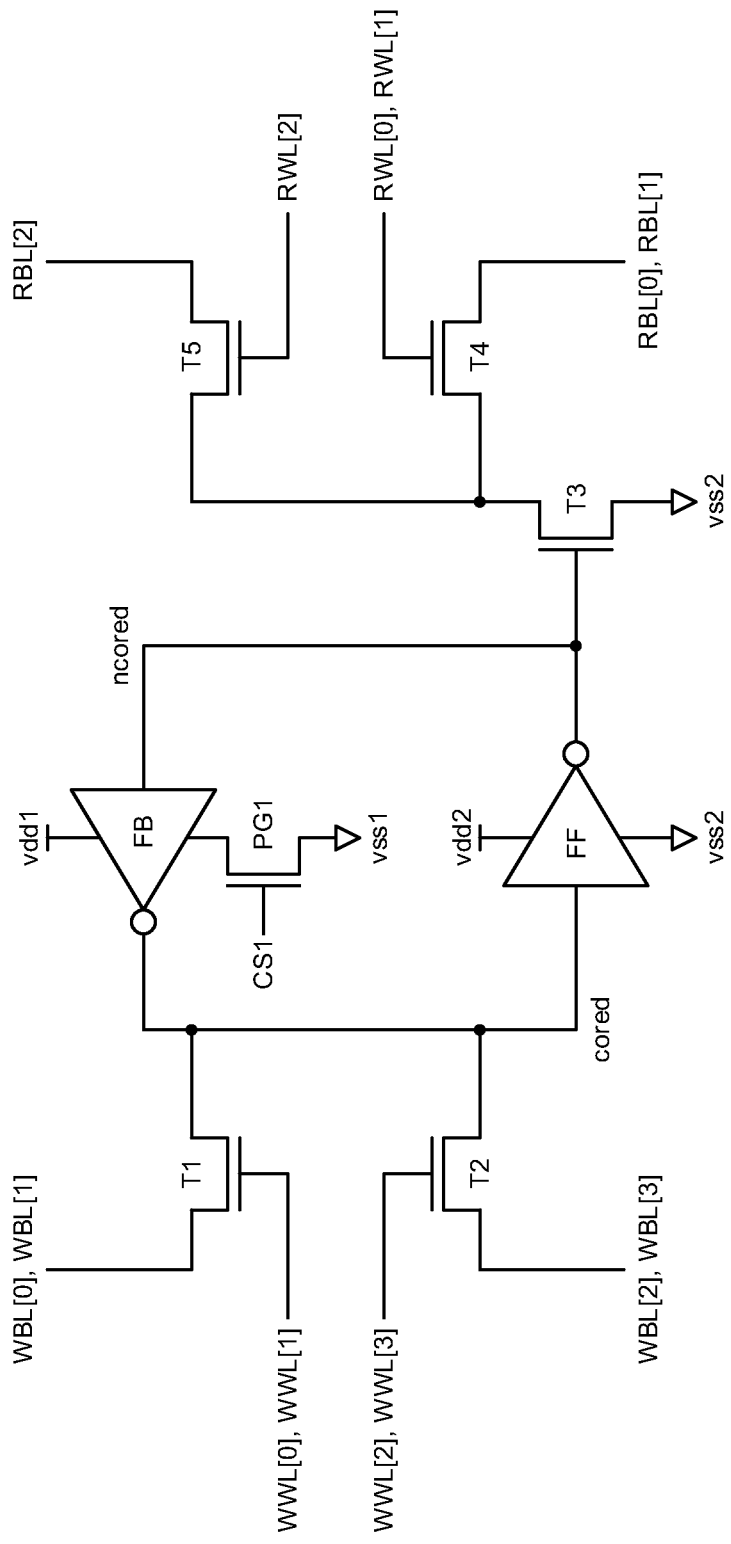
Figure 1C:
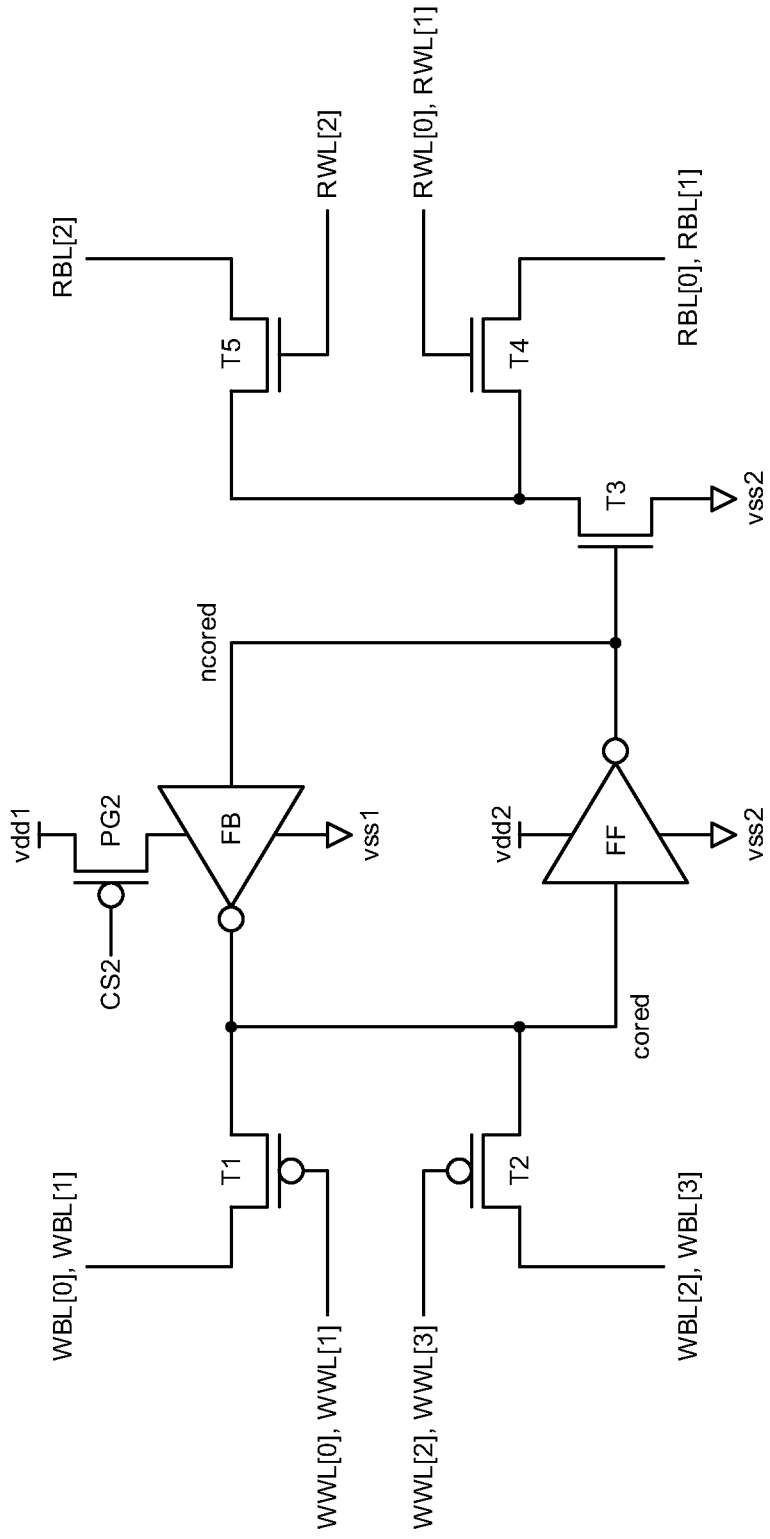
Figure 1D:
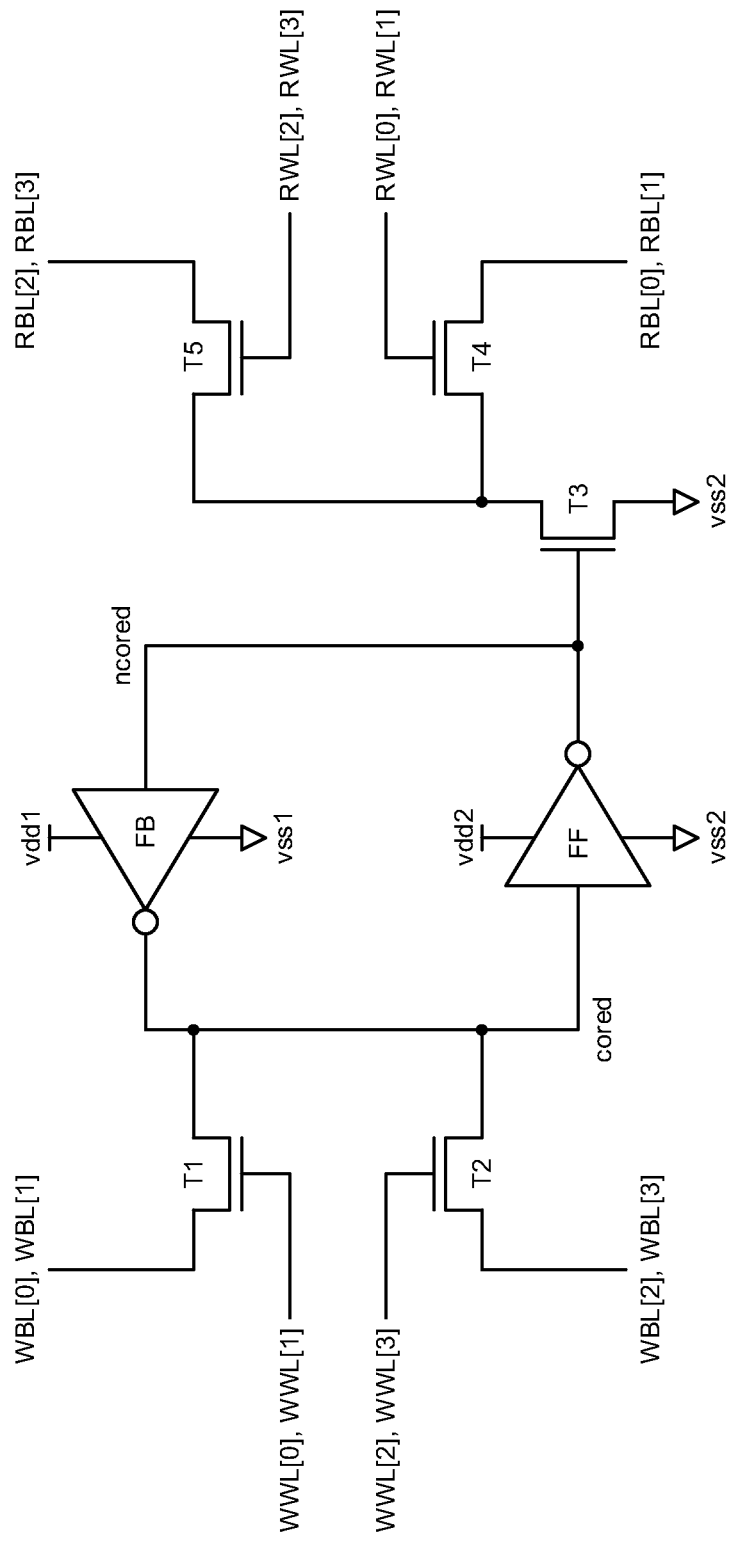

FIGS. 1A-1D illustrate various schematic diagrams of bitcell architecture 102 in accordance with implementations described herein. In particular, FIG. 1A shows the bitcell architecture 102 with a reduced set of nine transistors (9T) arranged in a read-write configuration 102A, FIG. 1B shows the bitcell architecture 102 with Vss power-gating 102B, FIG. 1C shows the bitcell architecture 102 with Vdd power-gating 102C, and also, FIG. 1D shows the bitcell architecture 102 with the reduced set of nine transistors (9T) arranged in another read-write configuration 102D.

In various implementations, the bitcell architecture 102 may refer to a system or device having various integrated circuit (IC) components that are arranged and coupled together as an assemblage or combination of parts that provide for physical circuit design and related structures. In some instances, a method of designing, providing and building the bitcell architecture 102 as an integrated system or device having the various IC circuit components described herein is provided so as to implement bitcell architecture schemes and techniques associated therewith. Also, the bitcell architecture 102 may be integrated with various logic devices on a single chip, and also, the bitcell architecture 102 may be implemented in embedded systems for automotive, electronic, mobile and Internet-of-things (IoT) applications, including remote sensor nodes.

As shown in FIG. 1A, the bitcell architecture 102 may have the reduced set of nine transistors (9T) arranged in the read-write configuration 102A. In some instances, the bitcell architecture 102 may include a memory cell having logic (e.g., transistors and/or inverters) that are configured to store data and passgates (e.g., T1-T5) that are configured to access the data stored in the logic. For instance, the logic may include transistors (T1, T2, T3, T4, T5) and inverters (FB, FF) that are coupled together to operate as a bitcell that is configured to store data, and also, the transistors (T1, T2, T3, T4, T5) may operate as the passgates for accessing data stored in the bitcell. The bitcell may be implemented as static random access memory (SRAM) with multiple transistors, such as, e.g., at least nine transistors (9T), which may include two transistors for each inverter (FB, FF) along with the five passgate transistors (T1-T5). The bitcell architecture 102 may use multiple source voltages (vdd1, vdd2) and multiple grounds (vss1, vss2) may or may not have the same or different voltage values. Also, in some instances, the transistors (T1-T5) may be implemented with n-type metal-oxide-semiconductor (NMOS) transistors. However, other implementations and/or circuit configurations may be used. The inverters (FB, FF) may each include one NMOS transistor and one p-type MOS (PMOS) transistor.

In some instances, the bitcell architecture 102 may include multiple input-output (IO) ports for multiple bitlines and multiple wordlines. For instance, the bitcell architecture 102 may include write bitlines (WBL), write wordlines (WWL), read bitlines (RBL), and read wordlines (RWL). The write bitlines (WBL) may include a first set of write bitlines (WBL[0], WBL[1]) and a second set of write bitlines (WBL[2], WBL[3]). The write wordlines (WWL) may include a first set of write wordlines (WWL[0], WWL[1]) and a second set of write wordlines (WWL[2], WWL[3]). The read bitlines (RBL) may include a first set of read bitlines (RBL[0], RBL[1]) and a second set of read bitlines (RBL[2]). The read wordlines (RWL) may include a first set of read wordlines (RWL[0], RWL[1]) and a second set of read wordlines (RWL[2]). The sets may be referred to as double-pumped, wherein each set of bitlines and wordlines are doubled for each corresponding IO port.

In some instances, in reference to write ports, the bitcell architecture 102 may include a first transistor (T1) coupled between the write bitlines (WBL[0], WBL[1]) and a cored node of the bitcell, and also, the gate of the first transistor (T1) may be coupled to the write wordlines (WWL[0], WWL[1]) for activation thereof. The bitcell architecture 102 may include a second transistor (T2) coupled between the write bitlines (WBL[2], WBL[3]) and the cored node of the bitcell, and also, the gate of the second transistor (T2) may be coupled to the write wordlines (WWL[2], WWL[3]) for activation thereof.

In some instances, in reference to read ports, the bitcell architecture 102 may include a third transistor (T3) coupled between transistors (T4, T5) and ground (vss2), and the gate of the third transistor (T3) may be coupled to an ncored node of the bitcell for activation thereof. Also, the bitcell architecture 102 may include a fourth transistor (T4) coupled between the read bitlines (RBL[0], RBL[1]) and the third transistor (T3), and the gate of the fourth transistor (T4) may be coupled to the read wordlines (WWL[0], WWL[1]) for activation thereof. Also, the bitcell architecture 102 may include a fifth transistor (T5) coupled between the read bitline (RBL[2]) and the third transistor (T3), and the gate of the fifth transistor (T5) may be coupled to the read wordline (WWL[2]) for activation thereof.

Also, in some instances, the bitcell architecture 102 may include a first number of input-output (IO) ports that are time-multiplexed with the passgates (e.g., T1-T5) so as to increase the first number of input-output (IO) ports to a second number of input-output (IO) ports that is greater than the first number of input-output (IO) ports. In this instance, the sets of IO ports may be referred to as double-pumped, wherein the sets of IO bitlines and IO wordlines are doubled for each corresponding IO port. As such, in some instances, the first number of input-output (IO) ports may be two, and the second number of input-output (IO) ports may be three or more. Also, the input-output (IO) ports may include write ports, and the first number of input-output (IO) ports may refer to two write ports, and the second number of input-output (IO) ports may refer to three or more write ports. Also, the input-output (IO) ports may include read ports, and the first number of input-output (IO) ports may refer to two read ports, and the second number of input-output (IO) ports may refer to three or more read ports.

In reference to write ports, the two write bitlines (WBL[0], WBL[1]) are coupled to a single IO port associated with transistor (T1), and also, the two write bitlines (WBL[2], WBL[3]) are coupled to another single IO port associated with transistor (T2). Further, in reference to write ports, the two write wordlines (WWL[0], WWL[1]) are coupled to a single IO wordline port associated with the gate of transistor (T1), and also, in some instances, the two write wordlines (WWL[2], WWL[3]) are coupled to another single IO wordline port associated with the gate of transistor (T2).

In reference to read ports, the two read bitlines (RBL[0], RBL[1]) are coupled to a single IO port associated with transistor (T4), and also, the read bitline (RBL[2]) is coupled to another single IO port associated with transistor (T5). Further, in reference to the read ports, the two read wordlines (RWL[0], RWL[1]) are coupled to a single IO wordline port associated with the gate of transistor (T4), and also, in some instances, the read wordline (RWL[2]) is coupled to another single IO wordline port associated with the gate of transistor (T5).

Thus, in various implementations, in reference to the number of read-write ports associated with the bitcell, the bitcell architecture 102 may be implemented with various IO port configurations. For instance, the bitcell architecture 102 may be implemented as a 4W3R bitcell with four write ports and three read ports. In other instances, the bitcell architecture 102 may be implemented as a 4W4R bitcell with four write ports and four read ports. In various other instances, the 9T bitcell may be configured to support various other IO port configurations having multiple write ports and multiple read ports.

In some instances, in reference to the 9T bitcell, the bitcell architecture 102 may include passgates (T1, T2) as write passgates that are coupled to the 9T bitcell for writing data to the 9T bitcell, and passgates (T4, T5) may include read passgates that are coupled to the 9T bitcell for reading data from the 9T bitcell. In some instances, the 9T bitcell may be referred to as an unbalanced bitcell.

As shown in FIG. 1A, the inverters (FB, FF) may include a feedback inverter (FB) and a feed-forward inverter (FF). The inverters (FB, FF) have transistors, and one or more or all of the passgates (T1-T5) may be sized to be stronger than the transistors of the inverters (FB, FF). The feedback inverter (FB) may have a source supply terminal (+) coupled to a first source voltage (vdd1) and a ground supply terminal (−) coupled to a first ground voltage (vss1). Also, the feed-forward inverter (FF) may have a source supply terminal (+) coupled to a second source voltage (vdd2) and a ground supply terminal (−) coupled to a second ground voltage (vss2). In some instance, the source voltages (vdd1, vdd2) may be the same or different, and also, the ground voltages (Vss1, Vss2) may be the same or different. Also, the input of the feed-forward inverter (FF) is coupled to the output of the feedback inverter (FB), and the input of the feedback inverter (FB) is coupled to the output of the feed-forward inverter (FF).

As shown in FIG. 1B, the bitcell architecture 102 may have the reduced set of nine transistors (9T) along with Vss power-gating 102B. The bitcell architecture 102 in FIG. 1B is similar in scope and configuration as the bitcell architecture 102 in FIG. 1A except for the addition of the footer transistor (PG1) coupled between the ground supply terminal (−) of the feedback inverter (FB) and the first ground voltage (vss1). As such, the ground supply terminal of the feedback inverter (FB) is coupled to ground (vss1) via the footer transistor (PG1) that is power-gated with a first control signal (CS1). Also, the footer transistor (PG1) may be implemented with an NMOS transistor.

As shown in FIG. 1C, the bitcell architecture 102 may have the reduced set of nine transistors (9T) along with Vdd power-gating 102C. The bitcell architecture 102 in FIG. 1C is similar in scope and configuration as the bitcell architecture 102 in FIG. 1A except for the addition of the header transistor (PG2) coupled between the source supply terminal (+) of the feedback inverter (FB) and the first source voltage (vdd1). Thus, the source supply terminal of the feedback inverter (FB) may be coupled to the source voltage (vdd1) via the header transistor (PG2) that is power-gated with a second control signal (CS2). Also, the header transistor (PG2) may implemented with a PMOS transistor.

As shown in FIG. 1D, the bitcell architecture 102 may have the reduced set of nine transistors (9T) arranged in another read-write configuration 102D. Also, the bitcell architecture 102 in FIG. 1D is similar in scope and configuration as bitcell architecture 102 in FIG. 1A except for the addition of IO read ports (RBL[3], RWL[3]). For instance, the fifth transistor (T5) may be coupled between the read bitlines (RBL[2], RBL[3]) and the third transistor (T3), and the gate of the fifth transistor (T5) may be coupled to the read wordlines (WWL[2], WWL[3]) for activation thereof. Therefore, the bitcell architecture 102 in FIG. 1D may have four write ports and four read ports (i.e., 4W4R).

In some implementations, in reference to write operations, the 9T bitcell shown in FIGS. 1A-1D may provide for a single-ended write operation that writes through either transistor (T1) or transistor (T2) based on the active port write wordline (WWL). The 9T bitcell structure may be double-pumped with unbalanced transistors. In some instances, when writing a 0 to the cored node, the passgates (T1, T2) may be sized to be stronger than one or more of the transistors within the inverters (FB). Also, in other instances, when writing a 1 through the passgates (T1, T2), which may be a weak write due to a Vth drop, the NMOS of the feedback inverter (FB) may be made weaker by using a transient Vss droop on the vss1 supply through the series-connected footer transistor (PG1), as shown in FIG. 1B. Also, in other instances, when writing a 0 through the passgates (T1, T2), which may refer to a weak write due to a Vth drop, the PMOS of the feedback inverter (FB) may be made weaker by using a transient Vdd droop on the vdd1 supply through the series-connected footer transistor (PG2), as shown in FIG. 1C.

In some implementations, in reference to read operations, the read ports may be similar to a register file bitcell except for being double-pumped like the write operation, and also being operated in a different phase of the clock when compared to the write as any side effects of the write operation (e.g., ncored write transients and/or TVD related transients) does not disturb the read operation.

Figure 2A:
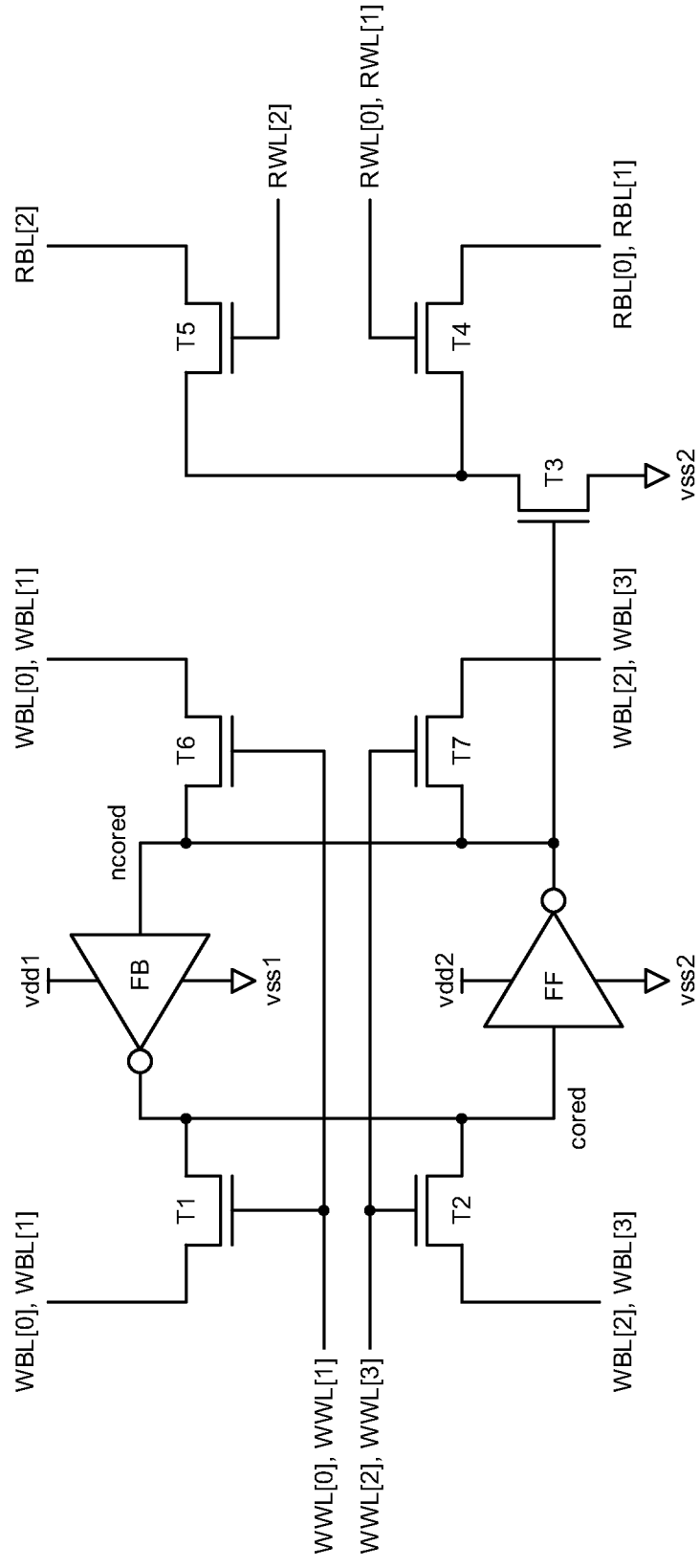
FIGS. 2A-2B illustrate various diagrams of bitcell architecture in accordance with various implementations described herein.
Figure 2B:
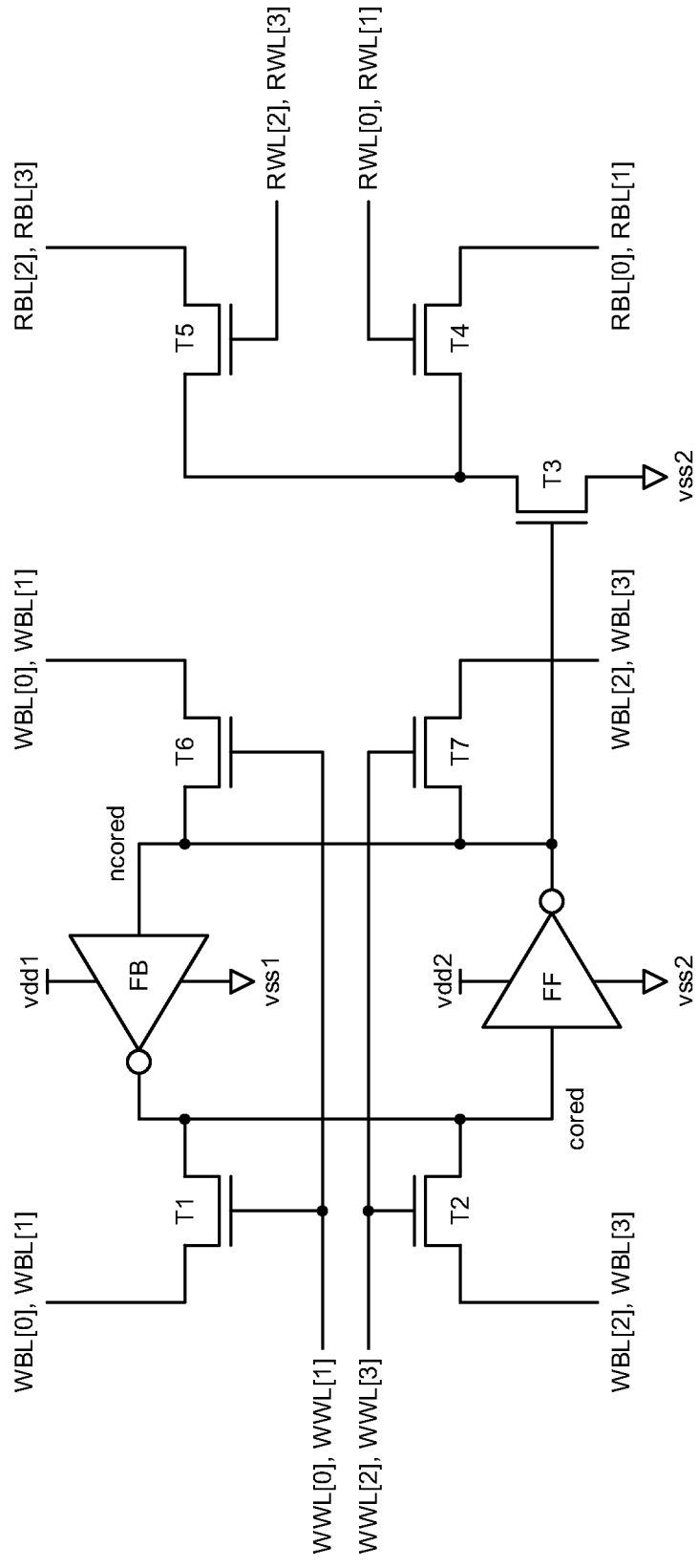

FIGS. 2A-2B illustrate various diagrams of bitcell architecture in accordance with various implementations described herein. In particular, FIG. 2A shows the bitcell architecture 202 with a reduced set of eleven transistors (11T) arranged in a read-write configuration 202A, and FIG. 2B shows the bitcell architecture 202 with the reduced set of eleven transistors (11T) arranged in another read-write configuration 202B.

In various implementations, the bitcell architecture 202 may refer to a system or device having various integrated circuit (IC) components that are arranged and coupled together as an assemblage or combination of parts that provide for physical circuit design and related structures. In some instances, a method of designing, providing and building the bitcell architecture 202 as an integrated system or device that may be implemented with various IC circuit components described herein is provided so as to implement bitcell architecture schemes and techniques associated therewith. The bitcell architecture 202 may be integrated with various logic devices on a single chip, and the bitcell architecture 202 may be implemented in various embedded systems for automotive, electronic, mobile and Internet-of-things (IoT) applications, including remote sensor nodes.

As shown in FIG. 2A, the bitcell architecture 202 may have the reduced set of eleven transistors (11T) arranged in the read-write configuration 202A. Also, the bitcell architecture 202 in FIG. 2A is similar in scope and configuration as bitcell architecture 102 in FIG. 1A except for the addition two more write passgates (T6, T7) that provide for balanced transistor logic in the bitcell. Thus, in some instances, the memory cell may refer to an eleven-transistor (11T) bitcell, wherein the passgates (T1-T7) may include write passgates (T1, T2, T6, T7) that are coupled to the 11T bitcell for writing data to the 11T bitcell, and the passgates (T1-T7) may also include read passgates (T3, T4, T5) that are coupled to the 11T bitcell for reading data from the 11T bitcell.

In some instances, the bitcell architecture 202 may include a sixth transistor (T6) coupled between the write bitlines (WBL[0], WBL[1]) and the ncored node, and also, the gate of the sixth transistor (T6) may be coupled to the write wordlines (WWL[0], WWL[1]) for activation thereof. Further, the bitcell architecture 202 may include a seventh transistor (T7) coupled between the write bitlines (WBL[2], WBL[3]) and the ncored node, and also, the gate of the seventh transistor (T7) may be coupled to the write wordlines (WWL[2], WWL[3]) for activation thereof. In this instance, the 11T bitcell shown in FIG. 2A may have four write ports and three read ports (i.e., 4W3R).

As shown in FIG. 2B, the bitcell architecture 202 may have the reduced set of eleven transistors (11T) arranged in another read-write configuration 202B. In some instances, the bitcell architecture 202 in FIG. 2A is similar in scope and configuration as the bitcell architecture 102 in FIG. 1A except for the addition of IO read ports (RBL[3], RWL[3]). For instance, the fifth transistor (T5) may be coupled between the read bitlines (RBL[2], RBL[3]) and the third transistor (T3), and the gate of the fifth transistor (T5) may be coupled to the read wordlines (WWL[2], WWL[3]) for activation thereof. Thus, in this instance, the bitcell architecture 202 in FIG. 2A may have four write ports and four read ports (i.e., 4W4R).

In some implementations, in reference to FIGS. 1A-1D and FIGS. 2A-2B, the bitcell architectures 102, 202 may refer to a memory structure having bitcell circuitry with transistor logic configured to store data and passgates configured to access the data stored in the transistor logic. Also, the memory structure may include read-write circuitry that is time-multiplexed with the passgates so as to increase a first number of read-write ports to a second number of read-write ports that is greater than the first number of read-write ports. In some instances, the bitcell circuitry may refer to a double-pumped bitcell architecture that is configured to perform at least one write operation and at least one read operation in a single clock cycle. Also, the read-write ports may include write ports and read ports, and the first number of read-write ports may refer to two write ports and two read ports, and further, the second number of read-write ports may refer to three or more write ports and three or more read ports.

In some instances, as shown in FIGS. 1A-1D, the bitcell circuitry may refer to a bitcell architecture having unbalanced (9T) transistor logic that is implemented with an unbalanced nine-transistor (9T) bitcell structure. The passgates may include double-pumped write passgates that are coupled to the unbalanced 9T bitcell structure for writing data to the unbalanced 9T bitcell structure. The passgates may include double-pumped read passgates that are also coupled to the unbalanced 9T bitcell structure for reading data from the unbalanced 9T bitcell structure.

In some instances, as shown in FIGS. 2A-2B, the bitcell circuitry may refer to a bitcell architecture having balanced (11T) transistor logic that is implemented with a balanced eleven-transistor (11T) bitcell structure. The passgates may include double-pumped write passgates that are coupled to the balanced 11T bitcell structure for writing data to the balanced 11T bitcell structure. The passgates may include double-pumped read passgates that are also coupled to the balanced 11T bitcell structure for reading data from the balanced 11 bitcell structure.

In some implementations, the 11T bitcell shown in FIGS. 2A-2B may provide for solving issues for writing a 1 by having a dual-ended write as in the regular register file bitcells. The 11T bitcell structure may be double-pumped with balanced transistors. Also, in various instances, the 11T bitcell structure may support different numbers of read and write ports, e.g., the 11T bitcell may support 4W4R, 2W6R, 1W7R configurations.

Figure 3:
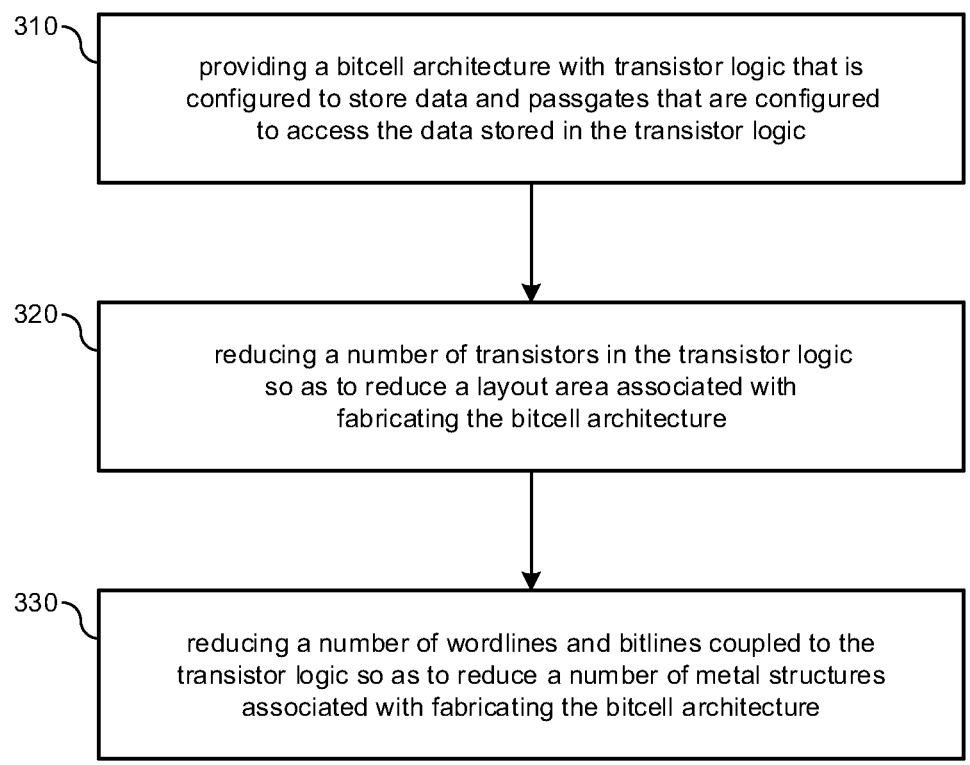
FIG. 3 illustrates a diagram of a method for fabricating bitcell architecture in accordance with various implementations described herein.

FIG. 3 illustrates a diagram of a method 300 for fabricating bitcell architecture in accordance with various implementations described herein.

It should be understood that even though method 300 may indicate a particular order of operation execution, in some cases, various portions of the operations may be executed in a different order, and on different systems. In other cases, other operations and/or steps may be added to and/or omitted from method 300. Also, method 300 may be implemented in hardware and/or software. If implemented in hardware, method 300 may be implemented with components and/or circuitry, as described herein in reference to FIGS. 1A-2B. Also, if implemented in software, method 300 may be implemented as a program and/or software instruction process configured for providing bitcell architecture in a manner as described herein. Also, if implemented in software, instructions related to implementing method 300 may be recorded in memory and/or a database. Also, various types of computing devices having at least one processor and memory may be configured to perform method 300 in accordance with various techniques described herein.

In various implementations, method 300 may refer to a method of designing, providing, building, fabricating and/or manufacturing bitcell architecture as an integrated system, device and/or circuitry that may involve use of the various circuit components described herein so as to implement various bitcell architecture schemes and techniques associated therewith. In some implementations, the bitcell architecture may be integrated with computing circuitry and various related components on a single chip, and the bitcell architecture may be implemented in various embedded chip-level systems for electronic, mobile and Internet-of-things (IoT) applications, including sensor node applications.

At block 310, method 300 may provide a bitcell architecture with transistor logic and passgates, wherein the transistor logic may be configured to store data, and wherein the passgates may be configured to access the data stored in the transistor logic. In some instances, the bitcell architecture may refer to a double-pumped bitcell architecture that is configured to perform at least one write operation and at least one read operation in a single clock cycle associated with read-write operational cycles.

At block 320, method 300 may reduce a number of transistors in the transistor logic so as to reduce a layout area associated with fabricating the bitcell architecture. The transistor logic of the bitcell architecture may refer to unbalanced transistor logic having an unbalanced nine-transistor (9T) bitcell structure. Also, the passgates may include write passgates that are coupled to the unbalanced 9T bitcell structure for writing data to the unbalanced 9T bitcell structure, and the passgates may include read passgates that are coupled to the unbalanced 9T bitcell structure for reading data from the unbalanced 9T bitcell structure. In other implementations, the transistor logic of the bitcell architecture may refer to balanced transistor logic having a balanced eleven-transistor (11T) bitcell structure. The passgates may include write passgates that are coupled to the balanced 11T bitcell structure for writing data to the balanced 9T bitcell structure, and the passgates may include read passgates that are coupled to the balanced 11T bitcell structure for reading data from the balanced 11 bitcell structure. In various other instances, the bitcell structure may include any number transistors configured to perform similar functions.

At block 330, method 300 may reduce a number of wordlines and bitlines that are coupled to the transistor logic so as to reduce a number of metal structures associated with fabricating the bitcell architecture. In various instances, the bitcell architecture may have read-write circuitry that is time-multiplexed with the passgates so as to increase a first number of read-write ports to a second number of read-write ports that is greater than the first number of read-write ports. Also, in other instances, the first number of read-write ports may refer to two write ports and two read ports, and the second number of read-write ports may refer to three or more write ports and three or more read ports.

In various implementations, the 9T and 11T bitcell structures described herein may be used to reduce the number of transistors by double-pumping the IO ports. In the 11T bitcell configuration, the transistors are balanced by making devices that are paired or have equivalent function for the same size, layout, etc. For instance, the NMOS pull-down transistors in the inverters, or the passgate transistors, etc. may be the same size, layout, etc. Various embodiments of the 11T bitcell may support different numbers of read and write ports. The embodiment in FIG. 2A shows a 4W3R configuration, but the same transistor structure may also support various other configurations including 4W4R, 2W6R, 1W7R. This variation occurs because any of the dual rail write bitlines may be used as dual rail read bitlines instead. In the embodiment in FIG. 2A, two physical write ports (which include the write passgates and associated bitline wiring) are time-multiplexed (double-pumped) to achieve up to effectively 4 write ports, and the two physical read ports (which include the read passgates and associated read bitline wiring) are time-multiplexed (double-pumped) to achieve up to effectively 4 read ports (as shown, 1 effective read port is either unused or one of the physical read ports is not double-pumped).

Moreover, the read and write ports may operate in different portions of the clock cycle. In some embodiments, these different portions may be in different phases, and in other embodiments, there may have some overlap. Various embodiments may also show an asymmetric design. The embodiment in FIG. 1A also shows a 4W3R solution, but with only 9-transistors, and the embodiment shown in FIG. 1A may be similarly double-pumped as the embodiment in FIG. 2A, but the transistors may be asymmetric and the write bitlines may be single-ended. The asymmetric design may refer to at least one of the transistor sizes of the feedback (FB) inverters being smaller (i.e., weaker) than the feedforward (FF) transistor sizes. For instance, when passgate transistors are NMOS, the NMOS in the FB inverter needs to be smaller (i.e., weaker) than the NMOS in the FF inverter. In this case, the NMOS passgate transistors should be large enough so that the weak "1" being written at the cored node through the passgate transistors (T1, T2) may be configured to overcome the NMOS in the FB inverter.

In some implementations, the asymmetric design may have higher read/write margin requirements based on single-ended write bitlines and process variation. In the embodiment shown in FIG. 1A, the 9T bitcell shows a single-ended write writing through either passgates T1 or T2 based on the active port write wordline. For writing a 0 to the cored node, the passgates T1 and T2 may be sized to pull-down stronger than a pull-up transistor of the feedback inverter FB. In an asymmetric design, writing a 1 through the passgate T1 or T2 may result in a weak write of the 1 because of a Vth drop across the passgates T1 or T2. Thus, to overcome the Vth drop, the NMOS of the FB inverter may be made weaker either in addition to making the transistor smaller or by implementing a transient voltage bump on the Vss1 supply through the series-connected footer transistor (PG1). Similarly, when passgates T1 and T2 are implemented with PMOS, writing a 0 may be difficult, and a similar solution may refer to making the PMOS weaker in the FB inverter either by making the transistor smaller or by implementing a transient voltage drop on the Vdd1 supply through the series-connected header transistor (PG2). Other examples of asymmetric design may refer to turning-off the NMOS transistor PG1 in FIG. 1B and/or turning-off the PMOS transistor PG2 in FIG. 1C.

In some implementations, in both 9T and 11T configurations, the read operation may be double-pumped like the write operation, and also the read operation may operate in different portions of the clock cycle as compared to the write operation. This may help to ensure that the write stage has completed before the read stage is affected.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include a memory cell having logic that is configured to store data and passgates that are configured to access the data stored in the logic. The device may include a first number of input-output ports that are time-multiplexed with the passgates so as to increase the first number of input-output ports to a second number of input-output ports that is greater than the first number of input-output ports.

Described herein are various implementations of a memory structure. The memory structure may include bitcell circuitry having transistor logic that is configured to store data and passgates that are configured to access the data stored in the transistor logic. The memory structure may include read-write circuitry that is time-multiplexed with the passgates so as to increase a first number of read-write ports to a second number of read-write ports that is greater than the first number of read-write ports.

Described herein are various implementations of a method. The method may include providing a bitcell architecture with transistor logic that is configured to store data and passgates that are configured to access the data stored in the transistor logic. The method may include reducing a number of transistors in the transistor logic so as to reduce a layout area associated with fabricating the bitcell architecture. The method may include reducing a number of wordlines and bitlines coupled to the transistor logic so as to reduce a number of metal structures associated with fabricating the bitcell architecture.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device comprising:
a memory cell having logic and passgates, wherein the logic is configured to store data, and wherein the passgates are coupled to the logic and configured to access the data stored in the logic; and
a first number of input-output ports that are time-multiplexed with wordlines and bitlines coupled to the passgates so as to increase the first number of input-output ports to a second number of input-output ports that is greater than the first number of input-output ports,
wherein the passgates include a first write passgate and a second write passgate with outputs coupled together, wherein the passgates include a third write passgate and a fourth write passgate with outputs coupled together, wherein the wordlines include first write wordlines coupled to the first write passgate, wherein the wordlines include second write wordlines coupled to the second write passgate, wherein the wordlines include third write wordlines coupled to the third write passgate, and wherein the wordlines include fourth write wordlines coupled to the fourth write passgate.

2. The device of claim 1, wherein the first number of input-output ports is two, and wherein the second number of input-output ports is three or more.

3. The device of claim 1, wherein the input-output ports include write ports, wherein the first number of input-output ports refers to two write ports, and wherein the second number of input-output ports refers to three or more write ports.

4. The device of claim 1, wherein the input-output ports include read ports, wherein the first number of input-output ports refers to two read ports, and wherein the second number of input-output ports refers to three or more read ports.

5. The device of claim 1, wherein the input-output ports include read ports, wherein the first number of input-output ports refers to two read ports, and wherein the second number of input-output ports refers to four read ports.

6. The device of claim 1, wherein the memory cell comprises a nine-transistor (9T) bitcell, wherein the write passgates are coupled to the 9T bitcell for writing data to the 9T bitcell, and wherein the passgates include read passgates that are coupled to the 9T bitcell for reading data from the 9T bitcell.

7. The device of claim 1, wherein the memory cell comprises an eleven-transistor (11T) bitcell, wherein the write passgates are coupled to the 11T bitcell for writing data to the 11T bitcell, and wherein the passgates include read passgates that are coupled to the 11T bitcell for reading data from the 11T bitcell.

8. The device of claim 1, wherein the logic of the memory cell includes inverters, wherein the inverters have transistors, and wherein one or more of the write passgates are sized to be stronger than one or more of the transistors of the inverters.

9. The device of claim 8, wherein the inverters include a feedback inverter, and wherein a ground supply terminal of the feedback inverter is coupled to ground via a footer transistor that is power-gated with a control signal.

10. The device of claim 8, wherein the inverters include a feedback inverter, and wherein a source supply terminal of the feedback inverter is coupled to a source voltage via a header transistor that is power-gated with a control signal.

11. A memory structure comprising:
bitcell circuitry having transistor logic and passgates, wherein the transistor logic is configured to store data, and wherein the passgates are coupled to the transistor logic and configured to access the data stored in the transistor logic; and
read-write circuitry having wordlines and bitlines coupled to the passgates, wherein the passgates are time-multiplexed with the wordlines and the bitlines so as to increase a first number of read-write ports to a second number of read-write ports that is greater than the first number of read-write ports,
wherein the passgates include a first write passgate and a second write passgate with outputs coupled together, wherein the passgates include a third write passgate and a fourth write passgate with outputs coupled together, wherein the wordlines include first write wordlines coupled to the first write passgate, wherein the wordlines include second write wordlines coupled to the second write passgate, wherein the wordlines include third write wordlines coupled to the third write passgate, and wherein the wordlines include fourth write wordlines coupled to the fourth write passgate.

12. The structure of claim 11, wherein the bitcell circuitry comprises a double-pumped bitcell architecture that is configured to perform at least one write operation and at least one read operation in a single clock cycle.

13. The structure of claim 11, wherein the read-write ports include write ports and read ports, wherein the first number of read-write ports refers to two write ports and two read ports, and wherein the second number of read-write ports refers to three or more write ports and three or more read ports.

14. The structure of claim 11, wherein the transistor logic of the bitcell circuitry comprises unbalanced transistor logic having an unbalanced nine-transistor (9T) bitcell structure, and wherein the write passgates are coupled to the unbalanced 9T bitcell structure for writing data to the unbalanced 9T bitcell structure, and wherein the passgates include read passgates that are coupled to the unbalanced 9T bitcell structure for reading data from the unbalanced 9T bitcell structure.

15. The structure of claim 11, wherein the transistor logic of the bitcell circuitry comprises balanced transistor logic having a balanced eleven-transistor (11T) bitcell structure, and wherein the write passgates are coupled to the balanced 11T bitcell structure for writing data to the balanced 11T bitcell structure, and wherein the passgates include read passgates that are coupled to the balanced 11T bitcell structure for reading data from the balanced 11 bitcell structure.

16. A method comprising:
providing a bitcell architecture with transistor logic and passgates, wherein the transistor logic is configured to store data, wherein the passgates are configured to access the data stored in the transistor logic, wherein the passgates include a first write passgate and a second write passgate with outputs coupled together, wherein the passgates include a third write passgate and a fourth write passgate with outputs coupled together, wherein the wordlines include first write wordlines coupled to the first write passgate, wherein the wordlines include second write wordlines coupled to the second write passgate, wherein the wordlines include third write wordlines coupled to the third write passgate, and wherein the wordlines include fourth write wordlines coupled to the fourth write passgate;

reducing a number of the transistors in the transistor logic so as to reduce a layout area associated with fabricating the bitcell architecture; and reducing a number of wordlines and bitlines coupled to the transistor logic so as to reduce a number of metal structures associated with fabricating the bitcell architecture.

17. The method of claim 16, wherein the bitcell architecture comprises a double-pumped bitcell architecture that is configured to perform at least one write operation and at least one read operation in a single clock cycle.

18. The method of claim 16, wherein the bitcell architecture comprises:

read-write circuitry that is time-multiplexed with the passgates so as to increase a first number of read-write ports to a second number of read-write ports that is greater than the first number of read-write ports, wherein the first number of read-write ports refers to two write ports and two read ports, and wherein the second number of read-write ports refers to three or more write ports and three or more read ports.

19. The method of claim 16, wherein the transistor logic of the bitcell architecture includes unbalanced transistor logic having an unbalanced nine-transistor (9T) bitcell structure, and wherein the write passgates are coupled to the unbalanced 9T bitcell structure for writing data to the unbalanced 9T bitcell structure, and wherein the passgates include read passgates that are coupled to the unbalanced 9T bitcell structure for reading data from the unbalanced 9T bitcell structure.

20. The method of claim 16, wherein the transistor logic of the bitcell architecture includes balanced transistor logic having a balanced eleven-transistor (11T) bitcell structure, and wherein the write passgates are coupled to the balanced 11T bitcell structure for writing data to the balanced 11T bitcell structure, and wherein the passgates include read passgates that are coupled to the balanced 11T bitcell structure for reading data from the balanced 11 bitcell structure.

\* \* \* \* \*